(12) United States Patent
Liu et al.

(10) Patent No.: US 8,062,972 B2
(45) Date of Patent: Nov. 22, 2011

(54) SEMICONDUCTOR PROCESS

(75) Inventors: An-Chi Liu, Tainan (TW); Chih-Chien Huang, Tainan County (TW); Tien-Cheng Lan, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 172 days.

(21) Appl. No.: 12/547,780

(22) Filed: Aug. 26, 2009

(65) Prior Publication Data

US 2011/0053371 A1    Mar. 3, 2011

(51) Int. Cl.
*H01L 21/302* (2006.01)
(52) U.S. Cl. .......... 438/638; 438/622; 438/701
(58) Field of Classification Search .......... 438/622, 438/637–640, 700, 701; 257/E21.575, E21.579
See application file for complete search history.

(56) References Cited

U.S. PATENT DOCUMENTS

| | | | |
|---|---|---|---|
| 6,465,352 B1 * | 10/2002 | Aoki | 438/689 |
| 6,797,627 B1 | 9/2004 | Shih et al. | |
| 7,192,878 B2 | 3/2007 | Weng et al. | |
| 7,199,059 B2 | 4/2007 | Cheng et al. | |
| 7,628,866 B2 | 12/2009 | Lin et al. | |
| 2009/0142931 A1 | 6/2009 | Wang et al. | |

OTHER PUBLICATIONS

A. Matsushita, N. Ohashi, K. Inukai, H.J. Shin, S. Sone, K. Sudou, K. Misawa, I. Matsumoto, and N. Kobayashi, "Low Damage Ashing using H2/He plasma for Porous Ultra Low-k", 2003, pp. 147-149, Research Dept. 2, Semiconductor Leading Edge Technologies, Inc., Japan.

* cited by examiner

*Primary Examiner* — Thanhha Pham
(74) *Attorney, Agent, or Firm* — WPAT., PC; Justin King

(57) ABSTRACT

A semiconductor manufacturing process is provided. First, a substrate is provided, wherein a patterned conductive layer, a dielectric layer and a patterned metal hard mask layer are sequentially formed thereon. Thereafter, a portion of the dielectric layer is removed to form a damascene opening exposing the patterned conductive layer. Afterwards, the dielectric layer is heated to above 200° C. Thereafter, a plasma treatment process is performed on the damascene opening, wherein the gases used to generate the plasma include hydrogen gas and inert gas. Afterwards, a conductive layer is formed in the damascene opening to fill therein.

21 Claims, 4 Drawing Sheets

SEMICONDUCTOR PROCESS

BACKGROUND OF THE INVENTION

1. Field of Invention

The present invention relates to a semiconductor manufacturing process. More particularly, the present invention relates to a damascene process.

2. Description of Related Art

With the progress of integration of semiconductor devices, the use of multi-metal interconnects are becoming wide spread. Usually, the lower the resistance of the metal layer of the multi-metal interconnects is, the higher the reliability of elements is, and the better the performance of the element can be. Among metal materials, the copper is suitable to be used for the multi-level interconnects because the resistance of copper is low. However, as it is difficult to pattern the copper in the conventional photolithographic etching technique, a dual damascene process has been developed.

The dual damascene process is a technique that involves forming a trench and a via opening in a dielectric layer and then refilling a metal to form a metal wire and a via. Typically, several material layers such as the liner layer, the dielectric layer and the metal hard mask layer are sequentially formed over the substrate having the patterned conductive layer thereon and then a portion of the dielectric layer is removed to form the dual damascene opening, exposing the patterned conductive layer, in the dielectric layer. However, the stress variation and unbalanced stress between the metal hard mask layer, the dielectric layer and the liner layer lead to the unexpected shrinking or distortion of the dual damascene opening after it has been formed. Thus, the critical dimension of the dual damascene is smaller than expected. On the other words, the dual damascene formed with the use of the metal hard mask layer would confront the problem of the line distortion, which leads to the difficulty of performing the metal refilling process. Furthermore, the structure of the dual damascene will have the defects of via open or high resistance.

SUMMARY OF THE INVENTION

Accordingly, at least one objective of the present invention is to provide a semiconductor manufacturing process for forming a damascene opening having an expected critical dimension with the use of the metal hard mask layer.

To achieve these and other advantages and in accordance with the purpose of the invention, as embodied and broadly described herein, the invention provides a semiconductor manufacturing process. First, a substrate is provided, wherein a patterned conductive layer, a dielectric layer and a patterned metal hard mask layer are sequentially formed thereon. Thereafter, a portion of the dielectric layer is removed to form a damascene opening exposing the patterned conductive layer. Afterwards, the dielectric layer is heated to above 200° C. Thereafter, a plasma treatment process is performed on the damascene opening, wherein the gases used to generate the plasma include hydrogen gas and inert gas. Afterwards, a conductive layer is formed in the damascene opening to fill therein.

According to one embodiment of the present invention, the damascene opening is a dual damascene.

According to one embodiment of the present invention, the damascene opening is formed with a first critical dimension before the plasma treatment process is performed and the damascene has a second critical dimension larger than the first critical dimension after the plasma treatment process is performed.

According to one embodiment of the present invention, the molecule size of the inert gas is similar to the molecule size of the hydrogen.

According to one embodiment of the present invention, the inert gas is helium.

According to one embodiment of the present invention, the heating process is performed to heat up the first dielectric layer to the temperature of about 200° C.~350° C.

According to one embodiment of the present invention, in the plasma treatment process, the power source of the plasma is a microwave power source.

According to one embodiment of the present invention, a second dielectric layer is located between the first dielectric layer and the patterned metal hard mask layer.

According to one embodiment of the present invention, a liner layer is located between the patterned conductive layer and the first dielectric layer.

According to one embodiment of the present invention, the step of removing the portion of the first dielectric layer further comprises removing a portion of the liner layer.

According to one embodiment of the present invention, a ratio of the hydrogen to the inert gas in the mixture gas is about 1:25~1:10.

According to one embodiment of the present invention, a gas flow of the mixture gas is about 5000 sccm~10000 sccm.

According to one embodiment of the present invention, a power of the plasma treatment process is about 1000~2000 W.

According to one embodiment of the present invention, a pressure of the plasma treatment process is about 500 mTorr~1 Torr.

According to one embodiment of the present invention, the method for removing the portion of the first dielectric layer includes dry etching process.

According to one embodiment of the present invention, the method for removing the portion of the first dielectric layer is performed with the use of the fluorine-containing gas as an etching gas.

According to one embodiment of the present invention, before the heating process is performed, the semiconductor manufacturing process further comprises performing a cleaning process on the damascene opening.

According to one embodiment of the present invention, the cleaning process is performed with the use of a cleaning solution containing hydrofluoric acid.

According to one embodiment of the present invention, the cleaning solution comprises hydrofluoric acid of about 25~1000 ppm, sulfuric acid of about 3~10 wt % and water.

According to one embodiment of the present invention, after the cleaning process is performed and before the heating process is performed, the semiconductor manufacturing process further comprises performing a backside clean process.

According to one embodiment of the present invention, before the heating process is performed, the semiconductor manufacturing process further comprises performing a backside clean process.

According to one embodiment of the present invention, after the plasma treatment process is performed, the semiconductor manufacturing process further comprises performing a backside clean process.

According to the above description, in the semiconductor manufacturing process of the present invention, after the damascene opening is formed with the use of the metal hard mask layer, the plasma generated by the mixture gas of hydrogen and inert gas is used in the plasma treatment process on the damascene opening so that the dimension of the damascene opening can be enlarged and the critical dimension of the damascene opening is closed to the expected dimension.

On the other words, by using the semiconductor process of the present invention, the problems of line distortion due to the use of the metal hard mask layer for forming the damascene opening, via open and high resistance can be overcome. Furthermore, the device performance and yield of the damascene structure can be greatly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1G are cross-sectional views showing a semiconductor manufacturing process.

Figure 1A:
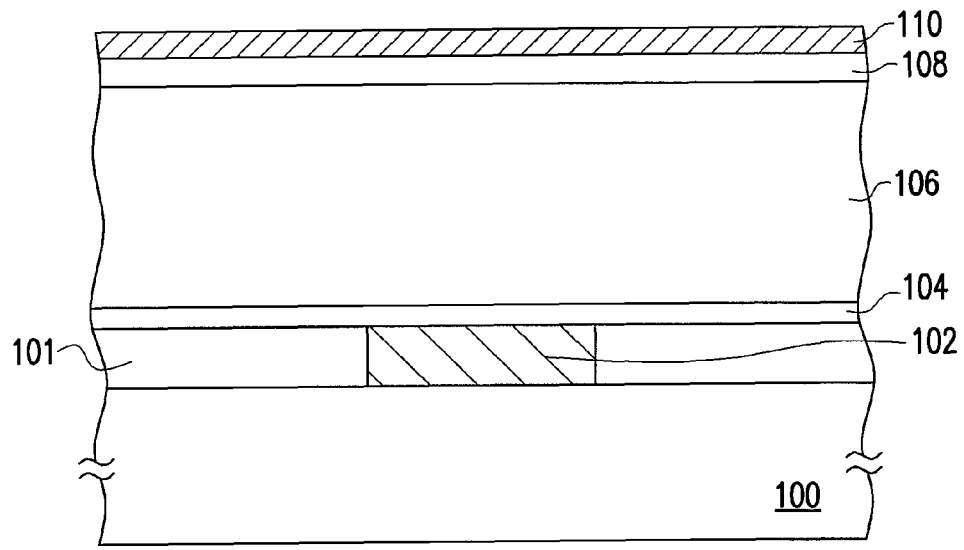
FIGS. 1A through 1G are cross-sectional views showing a semiconductor manufacturing process.

As shown in FIG. 1A, a substrate 100, having a patterned conductive layer 102 formed thereon, is provided. The substrate 100 can be, for example but not limited to, a silicon substrate. The patterned conductive layer 102 can be, for example but not limited to, a wire of the interconnects process and the wire can be, for example, the copper wire formed in a dielectric layer 101. Thereafter, a liner layer 104 is selectively formed on the substrate 100 and the material of the liner layer 104 can be, for example but not limited to, silicon carbonitride (SiCN).

Then, a dielectric layer 106 is formed over the substrate 100. The material of the dielectric layer 106 can be, for example but not limited to, low dielectric constant material (the dielectric constant k is less than 4). Furthermore, the method for forming dielectric layer 106 can be, for example, chemical vapor deposition (CVD). The low dielectric constant material layer can be, for example, the inorganic material, such as hydrogen silsesquioxane (HSQ) and fluorinated silicate glass (FSG), or can be, for example, the organic material, such as fluorinated poly-(arylene ether) (Flare), poly-(arylene ether) (SILK) and parylene. Thereafter, a dielectric layer 108 is selectively formed on the dielectric layer 106. The dielectric layer 108 can be, for example, made of tetraethosiloxane (TEOS) or silicon oxide.

Then, a metal hard mask layer 110 is formed over the dielectric layer 106. The metal hard mask layer 110 can be, for example, made of a material selected from a group comprising titanium, tantalum, tungsten, titanium nitride, tantalum nitride, tungsten nitride and the combination thereof. Moreover, the method for forming the hard mask layer 110 can be, for example, CVD or sputtering.

Figure 1B:
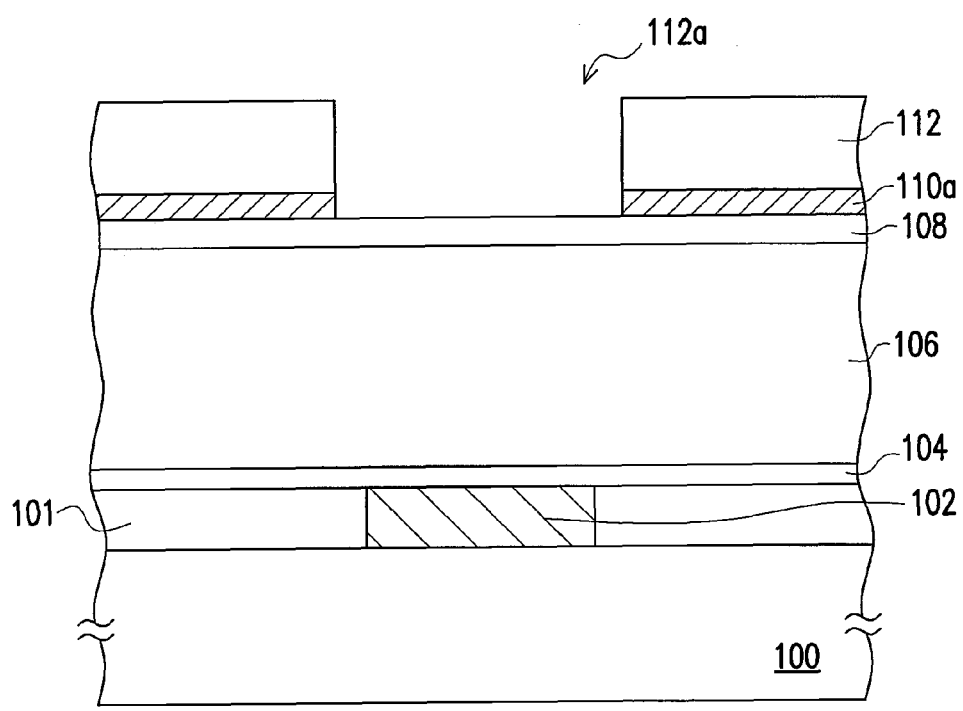

As shown in FIG. 1B, a patterned photoresist layer 112 having a trench pattern 112a therein is formed on the metal hard mask layer 110. Then, a portion of the metal hard mask layer 110 is removed to form a patterned metal hard mask layer 110a by using the patterned photoresist layer 112 as a mask.

Figure 1C:
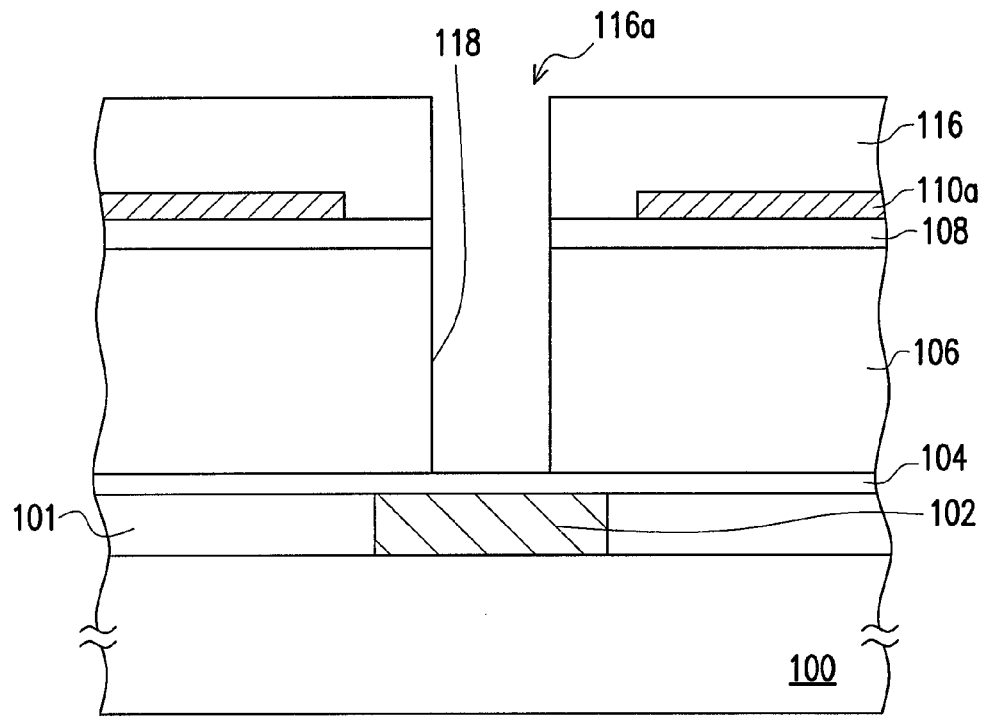

As shown in FIG. 1C, the patterned photoresist layer 112 is removed. Then, a patterned photoresist layer 116 having an opening pattern 116a therein is formed over the substrate 100. Thereafter, a portion of the dielectric layers 106 and 108 are removed to form an opening 118 by using the patterned photoresist layer 116 as a mask. The method for removing the portion of the dielectric layers 106 and 108 can be, for example, the dry etching process with the use of the etching gas such as a fluorine-containing gas.

Figure 1D:
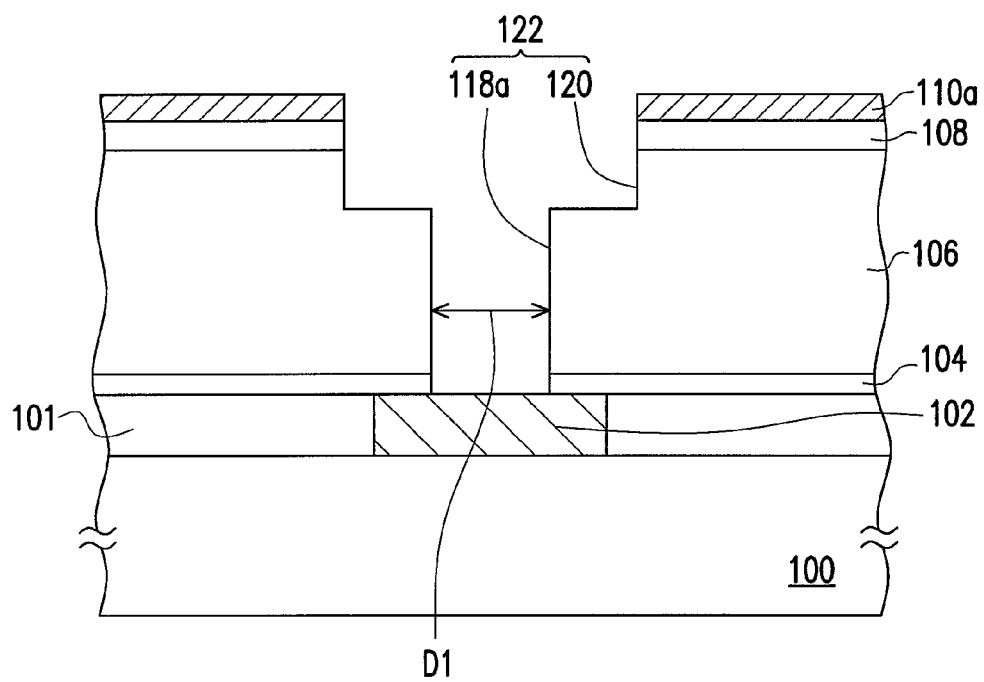

As shown in FIG. 1D, the patterned photoresist layer 116 is removed. Then, a portion of the dielectric layers 106 and 108 and a portion of the liner layer 104 are removed to form a trench 120 and a via opening 118a exposing the patterned conductive layer 102 by using the patterned hard mask layer 110a as a mask. The via opening 118a and the trench 120 together form a damascene opening 122 with a first critical dimension D1. The method for removing the portion of the dielectric layers 106 and 108 and the portion of the liner layer 104 can be, for example, the dry etching process with the use of the etching gas such as a fluorine-containing gas. It should be noticed that, the phenomenon including stress variation and unbalanced stress exists between the patterned metal hard mask layer 110a, the dielectric layer 108, the dielectric layer 106 and the liner layer 104 so that the dual damascene opening 122 is shrunk or distorted after it has been formed. That is, the critical dimension D1 of the dual damascene opening 122 is smaller than expected. Furthermore, noticeably, the method for forming the dual damascene opening as described in the present embodiment is one of the many methods for forming the dual damascene opening with the use of the metal hard mask layer and the skilled artisan should understand that the dual damascene opening can be formed by various well-known methods. Also, the method for forming the dual damascene opening is taken as an example for describing the present invention. However, in other examples, the damascene opening can be a unity damascene opening such as contact opening, via or trench.

Then, a cleaning process is selectively performed on the dual damascene opening 122 to remove polymer. In the present embodiment, the cleaning process can be, for example, a wet etching process with the use of the cleaning solution containing hydrofluoric acid. Furthermore, the cleaning solution can be, for example, containing hydrofluoric acid of about 25~1000 ppm, sulfuric acid of about 3~10 wt % and water.

Figure 1E:
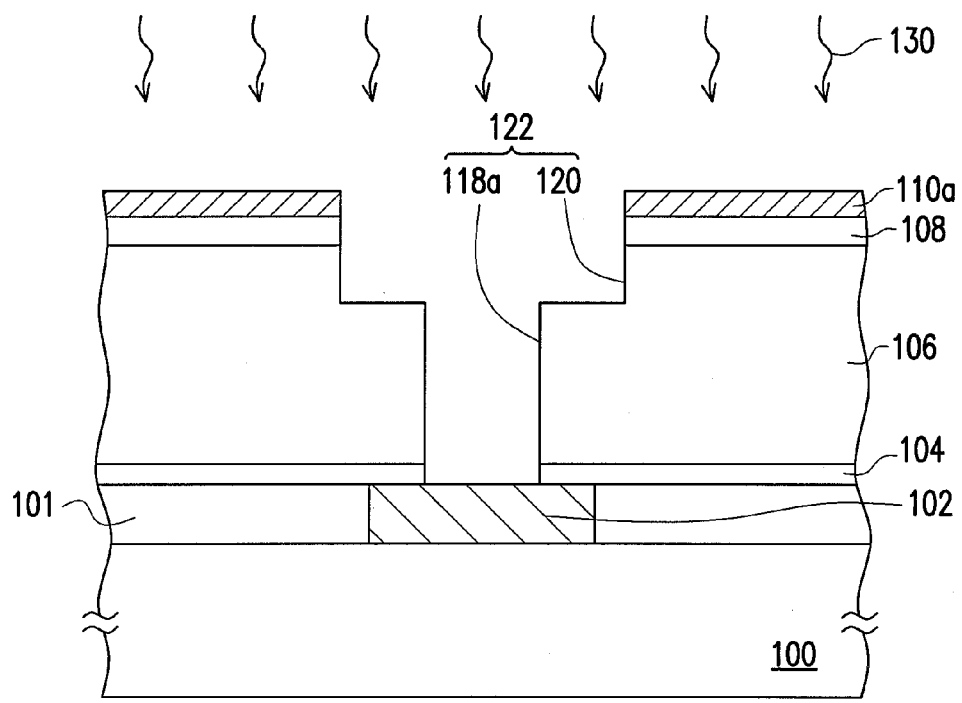

As shown in FIG. 1E, a heating process 130 is performed for heating the dielectric layer 106 to a temperature level greater than 200° C. In the present embodiment, the heating process 130 can be, for example, performed in a reaction chamber for performing a plasma etching process so that all of the substrate 100, the patterned conductive layer 102, the dielectric layer 106 and the patterned metal hard mask layer 110a are heated up to a temperature of about 200° C.~350° C.

Figure 1F:
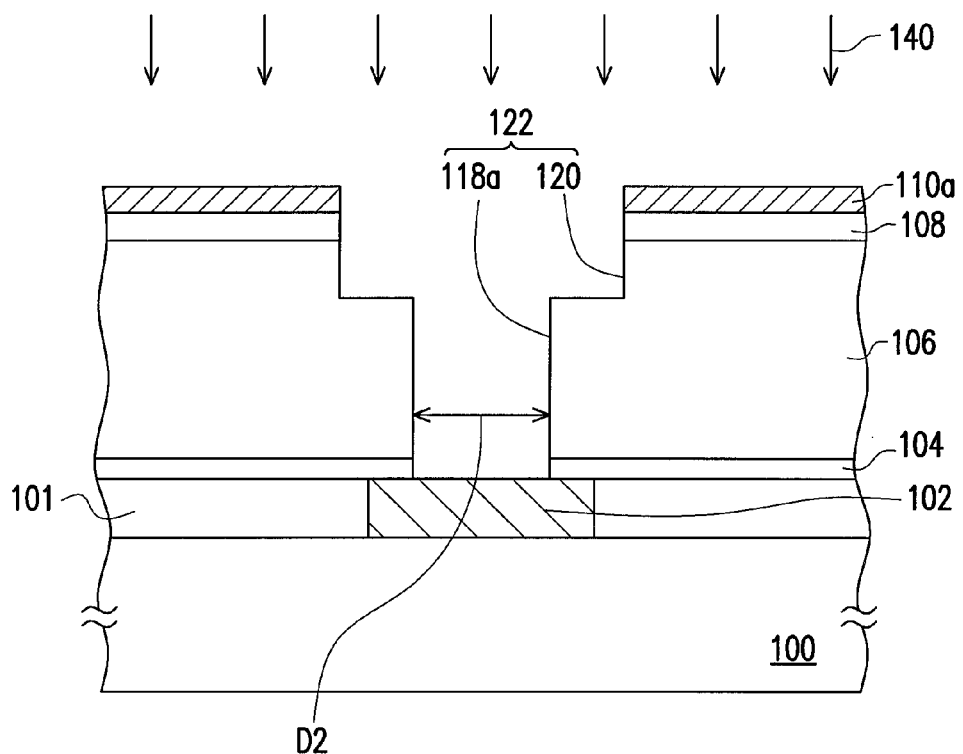

As shown in FIG. 1F, a plasma treatment process 140 is performed on the dual damascene opening 122 so that the dual damascene opening 122 possesses a second critical dimension D2 larger than the first critical dimension D1. The gas for generating the plasma in the plasma treatment process 140 can be, for example but not limited to, hydrogen and inert gas. In the present embodiment, the inert gas can be, for example, helium. That is, the mixture gas containing hydrogen and helium is used to generate the plasma in the plasma treatment process 140. Moreover, the ratio of the hydrogen to the inert gas is about 1:25~1:10. Preferably, the ratio of the hydrogen to the inert gas is about 1:10. The gas flow rate of the gas for generating the plasma is about 5000 sccm~10000 sccm. Preferably, gas flow rate of the gas for generating the plasma is about 7000 sccm. In the plasma treatment process 140, the pressure is about 500 mTorr~1 Torr. Moreover, in the plasma treatment process 140, the microwave power source is used as the power source, and the power is about 1000~2000 W. It should be noticed that, in the present embodiment, since the molecule size of the helium is similar to that of the hydrogen and both of the helium and hydrogen are small molecule gases so that the plasma generated by the hydrogen and helium has the advantages including better conductivity and high plasma temperature. Thus, the performance of the plasma treatment process is improved.

In the present embodiment, a backside clean process can be selectively performed between step of the cleaning process and the step of the heating process 130 or after the plasma treatment process 140 is performed in order to remove the residuum remaining on the backside of the substrate 100. The backside clean process can be, for example, the well-known wafer backside clean process for removing the copper residuum.

Figure 1G:
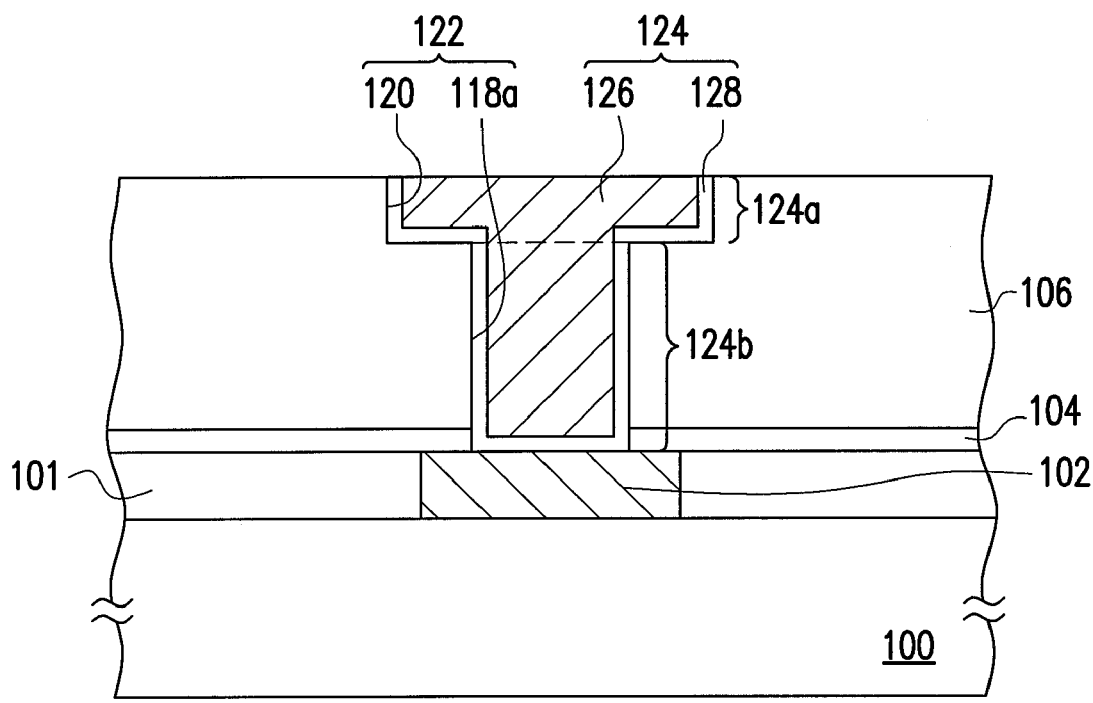

As shown in FIG. 1G, a conductive layer 124 is formed in the dual damascene opening 122 to fill the dual damascene opening 122. The conductive layer 124 can be, for example but not limited to, composed of a metal layer 126 and a barrier layer 128. The metal layer 126 can be, for example but not limited to, made of copper. The barrier layer 128 can be, for example but not limited to, made of titanium nitride or tantalum nitride. In the present embodiment, the method for forming the conductive layer 124 comprises forming a barrier material layer (not shown) and a metal material layer (not shown) over the substrate 100 for filling the dual damascene opening 122 and then removing a portion of the barrier material layer, the metal material layer, the dielectric layer 108 and the patterned metal hard mask layer 110a outside the dual damascene opening 122. The formed conductive layer 124 is a dual damascene structure comprising a wire 124a and a via 124b. Similarly, the skilled artisan should understand that the conductive layer can be formed by other well-known methods.

In the present embodiment, the semiconductor process comprises steps of forming the dual damascene opening by using the metal hard mask layer, performing the cleaning process on the dual damascene opening, performing the heating process on the dielectric layer, performing the plasma treatment process on the dual damascene opening, performing the backside clean process and forming the conductive layer in the dual damascene opening. Generally, in the process for forming the dual damascene opening with the use of the metal hard mask layer, since the stress variation and unbalanced stress exist between the metal hard mask layer, the dielectric layer and the liner layer, the dual damascene opening is shrunk or distorted after it has been formed and the critical dimension of the dual damascene is smaller than expected, which leads to line distortion. Further, it leads to the difficulty of performing the metal refilling process and the structure of the dual damascene will have the defects of via open or high resistance. In the present invention, after the dual damascene opening is formed with the use of the metal hard mask layer, the plasma generated by the mixture gas of hydrogen and inert gas is used in the plasma treatment process on the dual damascene opening so that the dimension of the dual damascene opening can be enlarged and the critical dimension of the dual damascene opening is closed to the expected dimension. Thus, the aforementioned problems can be solved. Moreover, the plasma treatment process can also be used to remove the residuum on the bottom of the dual damascene opening so that the later formed device can be prevent from having the possible defects caused by the residuum on the bottom of the dual damascene opening. On the other words, by using the semiconductor process of the present invention, the problems of line distortion due to the use of the metal hard mask layer for forming the dual damascene opening, via open and high resistance can be overcome. Furthermore, the device performance and yield of the dual damascene structure can be greatly improved.

Altogether, in the present invention, the damascene opening is formed by using the metal hard mask layer, the heating process is performed on the dielectric layer and the damascene is then treated by the plasma treatment process so that the damascene opening has the critical dimension as expected. That is, the shrinking or distortion of the damascene opening due to the stress between the various material layers such as the metal hard mask layer, the dielectric layer and the liner layer can be overcome by practicing the semiconductor manufacturing process of the present invention.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor manufacturing process, comprising:
    providing a substrate having a patterned conductive layer, a first dielectric layer and a patterned metal hard mask layer sequentially formed thereon;
    removing a portion of the first dielectric layer to form a damascene opening exposing a portion of the patterned conductive layer;
    performing a heating process for heating up the first dielectric layer to a temperature no less than 200° C.;
    performing a plasma treatment process on the damascene opening, wherein a plasma used in the plasma treatment process is generated by a mixture gas including hydrogen and inert gas, wherein the damascene opening is formed with a first critical dimension before the plasma treatment process is performed and the damascene opening has a second critical dimension larger than the first critical dimension after the plasma treatment process is performed; and
    forming a conductive layer in the damascene opening to fill the damascene opening.

2. The semiconductor manufacturing process of claim 1, wherein the damascene opening is a dual damascene.

3. The semiconductor manufacturing process of claim 1, wherein the molecule size of the inert gas is similar to the molecule size of the hydrogen.

4. The semiconductor manufacturing process of claim 1, wherein the inert gas is helium.

5. The semiconductor manufacturing process of claim 1, wherein the heating process is performed to heat up the first dielectric layer to the temperature of about 200° C.~350° C.

6. The semiconductor manufacturing process of claim 1, wherein, in the plasma treatment process, the power source of the plasma is a microwave power source.

7. The semiconductor manufacturing process of claim 1, wherein a second dielectric layer is located between the first dielectric layer and the patterned metal hard mask layer.

8. The semiconductor manufacturing process of claim 1, wherein a liner layer is located between the patterned conductive layer and the first dielectric layer.

9. The semiconductor manufacturing process of claim 8, wherein the step of removing the portion of the first dielectric layer further comprises removing a portion of the liner layer.

10. The semiconductor manufacturing process of claim 1, wherein a ratio of the hydrogen to the inert gas in the mixture gas is about 1:25~1:10.

11. The semiconductor manufacturing process of claim 1, wherein a gas flow of the mixture gas is about 5000 sccm~10000 sccm.

12. The semiconductor manufacturing process of claim 1, wherein a power of the plasma treatment process is about 1000~2000 W.

13. The semiconductor manufacturing process of claim 1, wherein a pressure of the plasma treatment process is about 500 mTorr~1 Torr.

14. The semiconductor manufacturing process of claim 1, wherein the method for removing the portion of the first dielectric layer includes dry etching process.

15. The semiconductor manufacturing process of claim 14, wherein the method for removing the portion of the first dielectric layer is performed with the use of a fluorine-containing gas as an etching gas.

16. The semiconductor manufacturing process of claim 1, before the heating process is performed, further comprising performing a cleaning process on the damascene opening.

17. The semiconductor manufacturing process of claim 16, wherein the cleaning process is performed with the use of a cleaning solution containing hydrofluoric acid.

18. The semiconductor manufacturing process of claim 17, wherein the cleaning solution comprises hydrofluoric acid of about 25~1000 ppm, sulfuric acid of about 3~10 wt % and water.

19. The semiconductor manufacturing process of claim 16, after the cleaning process is performed and before the heating process is performed, further comprising performing a backside clean process.

20. The semiconductor manufacturing process of claim 1, before the heating process is performed, further comprising performing a backside clean process.

21. The semiconductor manufacturing process of claim 1, after the plasma treatment process is performed, further comprising performing a backside clean process.

* * * * *